United States Patent

Fukaya

[11] Patent Number: 5,955,938
[45] Date of Patent: Sep. 21, 1999

[54] RUO₂ RESISTOR PASTE, SUBSTRATE AND OVERCOAT SYSTEM

[75] Inventor: Masashi Fukaya, Kuwana, Japan

[73] Assignee: Sumitomo Metal (SMI) Electronics Devices, Inc., Mine, Japan

[21] Appl. No.: 08/980,172

[22] Filed: Nov. 26, 1997

Related U.S. Application Data

[63] Continuation-in-part of application No. 08/596,600, Feb. 5, 1996, abandoned.

[30] Foreign Application Priority Data

Mar. 9, 1995 [JP] Japan .................................. 7/049726

[51] Int. Cl.⁶ .................................................. H01L 1/012
[52] U.S. Cl. ............................ 338/308; 338/309; 338/314; 338/254
[58] Field of Search ................................. 338/306, 307, 338/308, 309, 314, 254, 255

[56] References Cited

U.S. PATENT DOCUMENTS

| | | | |
|---|---|---|---|
| 3,304,199 | 2/1967 | Faber, Sr. et al. | 428/426 |
| 3,699,650 | 10/1972 | Cocca | 338/308 |
| 4,415,624 | 11/1983 | Prabhu et al. | 338/308 |
| 4,499,011 | 2/1985 | Boonstra et al. | 338/309 |
| 5,216,207 | 6/1993 | Prabhu et al. | 174/256 |
| 5,474,711 | 12/1995 | Borland et al. | 252/518.1 |

FOREIGN PATENT DOCUMENTS

| | | | |
|---|---|---|---|
| 3212901 | 9/1991 | Japan | 338/314 |
| 2217919 | 11/1989 | United Kingdom | 338/252 |

OTHER PUBLICATIONS

Fedrowitz et al. Glasses for Indium Oxide Paste Resistors, IBM TDB vol. 9, No. 11, p. 1477 (Apr. 1967).

Masashi Fukaya, et al; 1997 International Symposium on Microelectronics, pp. 65–71 (Oct. 1997).

*Primary Examiner*—Lincoln Donovan
*Assistant Examiner*—Karl Easthom
*Attorney, Agent, or Firm*—Flynn, Thiel, Boutell & Tanis, P.C.

[57] ABSTRACT

A ceramic circuit substrate having a resistor deposited on a surface thereof, said ceramic substrate having a coefficient of thermal expansion ranging from $5.0 \times 10^{-6}/°C$ to $7.0 \times 10^{-6}/°C$, the resistor being coated with a glass overcoat and made of 15 to 50% of $RuO_2$ and 85 to 50% of a $CaO-Al_2O_3-SiO_2-B_2O_3$-system glass, the glass overcoat being made of 60 to 100% of a $CaO-Al_2O_3-SiO_2-B_2O_3$-system glass and up to 40% of alumina, wherein the resistor has a coefficient of thermal expansion greater than that of the glass overcoat. Due to the above specific relationship between the coefficient of thermal expansion of the resistor and that of the overcoat, the resistor is not subject to cracking at the time of trimming and thereafter, and realizes the exertion of resistance performance ensuring excellent weather resistance and stability.

6 Claims, 1 Drawing Sheet

RUO₂ RESISTOR PASTE, SUBSTRATE AND OVERCOAT SYSTEM

CROSS REFERENCE TO RELATED APPLICATION

This application is a continuation-in-part of U.S. Ser. No. 08/596,600, filed Feb. 5, 1996, now abandoned.

BACKGROUND OF THE INVENTION

1. FIELD OF THE INVENTION

The present invention relates to a ceramic circuit substrate having on its surface an external resistor covered with a glass overcoat. More particularly, the present invention is concerned with a ceramic circuit substrate having an external resistor which stably maintains an accurate resistance value obtained by trimming.

2. DESCRIPTION OF PRIOR ART

Besides the internal resistor disposed between the layers of a multilayer circuit substrate, a ceramic circuit substrate for use in integral circuits is provided with a circuit comprising an external resistor and a conductor pattern printed on the surface of the ceramic circuit substrate, which contributes toward imparting an advanced function to the ceramic circuit substrate and reducing the production cost.

In the formation of a resistor on a substrate surface, generally, a conductive substance such as $RuO_2$ is added to a glass composition, rendered pasty, printed and sintered into the desired resistor. In the formation of the resistor, occasionally, printing is effected so as to cover the resistor with a glass material and followed by firing to form an overcoat in order to protect the resistor and to improve the weather resistance thereof. The obtained resistor has its resistance value finely adjusted by laser trimming.

Generally, an external resistor used in a ceramic circuit substrate is formed by firing a resistor at 800 to 900° C., printing a low-melting-point glass overcoat thereon, and firing at 500 to 600° C. The coefficient of thermal expansion of $RuO_2$ used in the resistor is about $6.0 \times 10^{-6}/°$ C. and that of the resistor comprising the same is $5.5 \times 10^{-6}/°$ C. to $7.0 \times 10^{-6}/°$ C. In contrast to this, the coefficient of thermal expansion of an alumina substrate is as large as $7.0 \times 10^{-6}/°$ C. to $8.0 \times 10^{-6}/°$ C., so that a compressive force is applied to the resistor formed on the alumina substrate. As a result, laser trimming of the resistor does not promote cracking.

In accordance with the miniaturization of electronic appliances and the high-density packaging therein, there is the tendency that the ceramic substrate is also provided in multilayer form to comply with high-density packaging and that use is made of substrate materials which each have a low coefficient of thermal expansion for mounting silicon chips thereon. As such circuit substrates, low-temperature firable substrates are used. However, when the resistor is formed on a substrate having a coefficient of thermal expansion smaller than that of the resistor, a tensile force is applied to the resistor after the firing, thereby causing the resistor to crack during laser trimming or thereafter.

The above situation will be described with reference to the drawings. FIG. 1 is a plan of one form of a conventional external resistor disposed on a ceramic circuit substrate of a ceramic circuit substrate, and FIG. 2 is a sectional view thereof. A wiring material such as a metal paste is printed on a ceramic substrate surface 1, thereby forming a conductor pattern 2 on the surface. Part thereof constitutes an electrode for a resistor 3. The resistor 3 is composed of glass components having a conductive material such as a metal added thereto. The upper part thereof is covered with an overcoat 4 composed of glass materials. The resistor 3 and the overcoat 4 constitute an external resistor 71. The overcoat 4 may either cover each individual resistor 3 a little wider than the same or uniformly cover a wide area of not only a plurality of resistors 3 but also a conductor pattern 2. When the overcoat covers such a wide area, via holes can be provided at suitable positions to thereby attain the continuity with the outside.

Laser trimming of such an external resistor 7 leads to formation of a trimming channel 5 in the overcoat 4 and the resistor 3, as shown in the figures.

Although laser trimming is generally conducted while measuring the resistance value exhibited by the resistor, the presence of expansion force in the resistor not only interferes with such precision trimming but also generates microcracks 6 from the trimming channels. Also, even if there is no occurrence of cracks during trimming, cracks may occur during the use as a product.

SUMMARY OF THE INVENTION

An object of the present invention is to provide a ceramic circuit substrate having an external resistor obtained by cofiring a resistor and an overcoat which has resolved the problem of cracking during and after laser trimming.

The inventors have made intensive studies to find out that the above objects can be attained when a specific relationship is established between the coefficient of thermal expansion of the resistor and that of the glass overcoat. The present invention has been arrived at on the basis of such a finding.

Accordingly, the present invention provides a ceramic circuit substrate having a resistor deposited on a surface thereof, said ceramic substrate having a coefficient of thermal expansion ranging from $5.0 \times 10^{-6}$-/° C. to $7.0 \times 10^{-6}/°$ C., the resistor being coated with a glass overcoat and consisting essentially of 15 to 50% of $RuO_2$ and 85 to 50% of a $CaO-Al_2O_3-SiO_2-B_2O_3$-system glass, the glass overcoat consisting essentially of 60 to 100% of a $CaO-Al_2O_3-SiO_2-B_2O_3$-system glass and up to 40% of alumina, wherein the resistor has a coefficient of thermal expansion greater than that of the glass overcoat.

DETAILED DESCRIPTION OF THE PREFERRED EMBODIMENT

Figure 1:
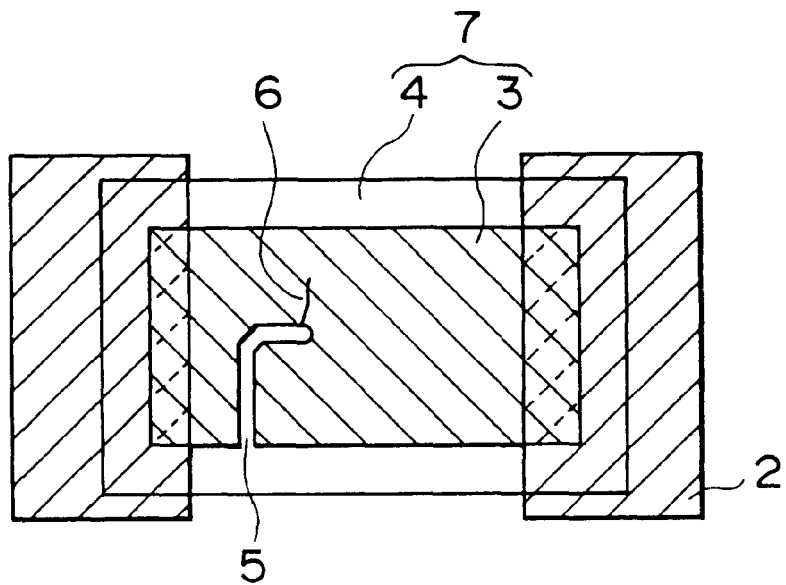
FIG. 1 is a view illustrating a conventional external resistor.
Figure 2:
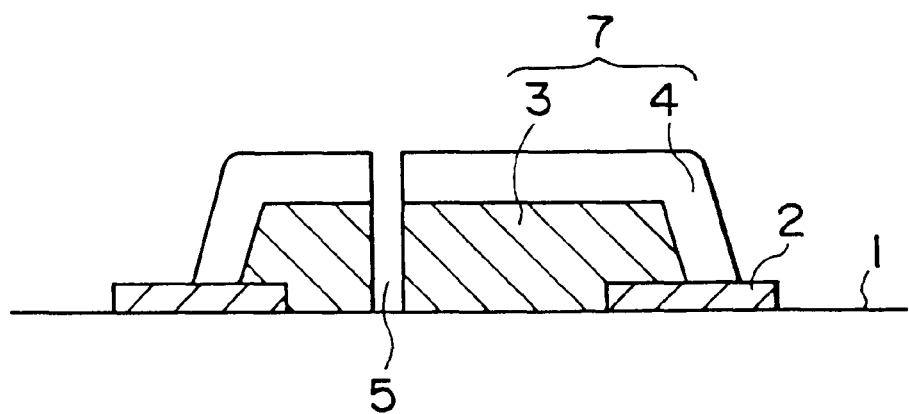
FIG. 2 is a sectional view of the resistor of FIG. 1.

The ceramic circuit substrate of the present invention may have any of the monolayer and multilayer constructions as long as a ceramic is used as an insulator. A multilayer ceramic circuit substrate can be produced by, for example, the green sheet lamination process or the green sheet and printing multilayer process. A circuit may be provided only on one side of the substrate or both sides thereof.

The ceramic material composing the ceramic substrate for use in the present invention is not particularly limited. Any ceramic material having a coefficient of thermal expansion ranging from $5.0 \times 10^{-6}/°$ C. to $7.0 \times 10^{-6}/°$ C. may be used. For example, a low-temperature firable ceramic can be used which is a mixture of alumina powder with glass powder. The conductor material for use as the inner layer is varied depending on the substrate material. When the substrate material is alumina or aluminum nitride, use is made of a high-melting-point metal such as molybdenum or tungsten. When the substrate material can be fired at relatively low temperatures, use is made of a metal such as gold, silver, a silver-palladium alloy, copper or nickel.

A low-temperature firable multilayer ceramic circuit substrate in which use is made of an Ag-based conductor which has a low conductor resistance and can be fired in the air, such as Ag, Ag—Pd, Ag—Pt or Ag—Pd—Pt, and in which a ceramic material capable of being fired at temperatures not higher than the melting point of the above conductor material (900 to 1200° C.) is used as an insulator is especially preferred as the ceramic circuit substrate of the present invention. Generally, a ceramic substrate which is fired at about 1200° C. or below is called "low-temperature firable ceramic substrate", in which, for example, an Ag-based or Cu-based conductor is used as conductors on inner and surface layers.

A ceramic material which can be fired at temperatures lower than the melting point of, for example, an inner Ag-based conductive material is preferably employed as the low-temperature firable ceramic insulating material. When use is made of an Ag conductor or an Ag alloy conductor in which the contents of Pd and Pt are low, because the melting point of such a metal formed in multiple layers is as low as about 900 to 1200° C., it is necessary to employ a material which can be fired at 800 to 1100° C. Representative examples of such materials include those based on a mixture of the powder of a glass such as borosilicate glass or glass further containing some oxides (e.g., MgO, CaO, $Al_2O_3$, PbO, $K_2O$, $Na_2O$, ZnO, $Li_2O$, etc.) with the powder of a ceramic such as alumina or quartz and those based on crystallizable glass powder which undergoes cordierite or α-spodumene crystallization.

Examples of the low-temperature firable substrate include those prepared by firing a CaO—$SiO_2$—$Al_2O_3$—$B_2O_3$— system glass or MgO—$SiO_2$—$Al_2O_3$—$B_2O_3$—system glass mixed with alumina powder.

The above material can be used not only in the monolayer form as mentioned above but also in the multilayer form. The multilayer substrate can be produced according to the green sheet lamination process in which a plurality of green sheets are employed. For example, a powdery ceramic insulating material mixed with additives (e.g., solvent, resin, etc.) is molded according to the doctor blade method into green sheets of about 0.1 to 0.5 mm in thickness. A paste of a conductor material such as Ag, Ag—Pd, Ag—Pt or Ag—Pd—Pt is screen printed on one of the green sheets to thereby give a desired wiring pattern. Through holes of about 0.1 to 2.0 mm in diameter are formed in the green sheet by means of blanking dies or a punching machine so as to enable connection to another conductor layer. Also, wiring via holes are formed and filled with an Ag conductive material. In the same manner, wiring patterns are printed on other green sheets as required for forming the desired circuit. These green sheets are accurately laminated is one upon another with the use of alignment holes respectively formed in the green sheets and unified by thermocompression bonding effected at 80 to 150° C. under 10 to 250 kg/cm².

When the circuit includes an inner resistor, an $RuO_2$-based or $Bi_2Ru_2O_7$-based resistor is formed which is fired in the air. In that case, it is printed together with terminals therefor on the green sheet for forming an inner layer.

The obtained structure is cofired in the air, thereby providing a ceramic multilayer substrate having conductors therein.

The present invention has been described with the low-temperature firable ceramic as an example. Although it is a preferred embodiment of the present invention, the present invention is not limited thereto.

An external resistor for use in the present invention comprises a resistor and a glass overcoat. These are generally individually printed in the form of a paste on a ceramic circuit substrate according to the thick-film process. The resistors consists essentially of 15 to 50% of an $RuO_2$, which may be in the form of $Bi_2Ru_2O_7$, and 50 to 85% of a glass component of CaO—$Al_2O_3$—$SiO_2$—$B_2O_3$ system, if desired, loaded with additives. The glass overcoat consists essentially of 60 to 100% of a CaO—$Al_2O_3$—$SiO_2$—$B_2O_3$ system glass and up to 40% of alumina, preferably 60 to 90% of the CaO—$Al_2O_3$—$SiO_2$—$B_2O_3$ system glass and 10 to 40% of alumina. As described above, the glasses used in the resistor and the glass overcoat should be so selected that the coefficient of the thermal expansion of the resistor is greater than that of the glass. In the present invention, the resistor and glass overcoat are cofired. The firing is usually conducted in the air.

The present invention will now be described in greater detail with reference to the following Examples and Comparative Examples. Throughout the specification, percentages (%) are by weight unless otherwise indicated.

EXAMPLE 1

A ceramic circuit substrate was prepared with the use of a low-temperature firable ceramic prepared according to the following procedure and having a coefficient of thermal expansion of $5.0 \times 10^{-6}/°$ C., $5.5 \times 10^{-6}/°$ C., $6.0 \times 10^{-6}/°$ C. or $6.9 \times 10^{-6}/°$ C. The composition, by weight, of each substrate is shown in Table 1. Each glass powder had an average particle size of 1.0 μm and was mixed with $Al_2O_3$ powder to form a powder component.

TABLE 1

Chemical Composition of Substrate and Resistor

| Chemical composition of substrate | coefficient of thermal expansion (× $10^{-6}$/°C.) | chemical composition of glass | | | | | glass: $Al_2O_3$ |
|---|---|---|---|---|---|---|---|
| | | CaO | $Al_2O_3$ | $SiO_2$ | $B_2O_3$ | other | |
| 5.0 | 12.2 | 19.8 | 52.9 | 15.1 | 0.7 | | 6:4 |
| | 26.8 | 6.0 | 57.6 | 8.7 | 0.9 | | 6:4 |
| 6.0 | 22.1 | 15.6 | 59.2 | 2.3 | 0.8 | | 65:35 |
| 6.9 | 36.1 | 10.3 | 41.2 | 8.7 | 0.7 | | 6:4 |

| Chemical composition of resistor | coefficient of thermal expansion (× $10^{-6}$/°C.) | chemical composition of glass | | | | | glass: $RuO_2$ |
|---|---|---|---|---|---|---|---|
| | | CaO | $Al_2O_3$ | $SiO_2$ | $B_2O_3$ | other | |
| A | 6.0 | 33.3 | 4.2 | 43.4 | 16.1 | 3.0 | 8:2 |
| B | 6.5 | 35.7 | 18.8 | 35.7 | 7.1 | 2.7 | 8:2 |
| C | 5.8 | 22.2 | 6.4 | 48.5 | 19.8 | 3.1 | 8:2 |
| D | 5.7 | 22.4 | 7.5 | 56.2 | 12.3 | 1.6 | 8:2 |
| E | 5.5 | 24.2 | 16.4 | 46.7 | 9.3 | 3.4 | 8:2 |
| F | 5.9 | 25.7 | 3.3 | 36.7 | 33.3 | 1.0 | 8:2 |
| G | 5.7 | 21.3 | 8.3 | 46.4 | 21.8 | 2.2 | 5:5 |
| H | 5.7 | 22.3 | 7.7 | 47.1 | 20.6 | 2.3 | 6:4 |
| I | 5.7 | 22.7 | 7.1 | 49.4 | 18.1 | 2.7 | 7:3 |
| J | 5.7 | 24.1 | 6.7 | 51.9 | 15.9 | 1.8 | 85:5 |

The chemical composition of each glass is expressed in wt. %.

The above powder component was mixed with, in weight percentages, 10% of acrylic resin, 30% of toluene, 10% of isopropyl alcohol and 5% of dibutyl phthalate in a ball mill and formed into a green sheet of 0.4 mm in thickness according to the doctor blade process. The respective weight percentages are shown based on the weight of the powder component. The resultant green sheet was perforated at given positions by means of dies and an Ag paste was screen printed to fill the holes therewith. The sheet was dried, and further the Ag paste was screen printed on the sheet to thereby form a wiring pattern. In the same manner, other green sheets having printed wiring patterns were prepared. A given number of obtained sheets were laminated one upon another and caused to undergo thermocompression bonding. The resultant laminate was fired by holding it at 900° C. for 20 min. Thus, a ceramic circuit substrate was obtained.

A resistor paste having each of the compositions specified in Table 1 was printed on the ceramic substrate so as to form a resistor of 1 mm in width and 2 mm in length having the coefficient of thermal expansion shown in Table 1. In the preparation of the resistance paste, use was made of an organic vehicle comprising ethyl-cellulose and terpineol. Each of the overcoat pastes prepared from the chemical compositions specified in Table 2 and an organic vehicle comprising ethyl-cellulose and terpineol was printed on the resultant resistor.

For these resistors and overcoats, cofiring was carried out in the air at 890° C. for 10 min.

The results are jointly given in Table 2. The rate of change of resistance means the maximum of the rate of change of resistance observed after repeating heating in the temperature range of from −55 to 150° C. 100 times after trimming, relative to the resistance obtained by trimming. Experiment Nos. 15 to 17 and 32 to 36 relate to comparative examples.

TABLE 2

Coefficient of Thermal Expansion and Rate of Change of Resistance

| Experiment No. | Coefficient of thermal expansion of substrate | Resistor | Coefficient of thermal expansion of resistor | Coefficient of thermal expansion of overcoat | Rate of change of resistance (%) | Chemical Composition of glass overcoat | | | | | | glass:$Al_2O_3$ |
|---|---|---|---|---|---|---|---|---|---|---|---|---|
| | | | | | | CaO | $Al_2O_3$ | $SiO_2$ | $B_2O_3$ | $Cr_2O_3$ | other | |
| 1 | 5.5 | A | 6.0 | 5.5 | 0.2 | 24.3 | 5.2 | 52.3 | 16.4 | 1.5 | 0.3 | 7:3 |
| 2 | 5.5 | A | 6.0 | 5.7 | 0.3 | 24.3 | 5.2 | 52.3 | 16.4 | 1.5 | 0.3 | 8:2 |
| 3 | 5.5 | A | 6.0 | 5.9 | 0.5 | 24.3 | 5.2 | 52.3 | 16.4 | 1.5 | 0.3 | 9:1 |
| 4 | 5.0 | A | 6.0 | 5.3 | 0.3 | 24.3 | 5.2 | 52.3 | 16.4 | 1.5 | 0.3 | 6:4 |
| 5 | 5.0 | A | 6.0 | 5.5 | 0.5 | 27.2 | 5.3 | 58.0 | 8.7 | 0.2 | 0.6 | 6:4 |
| 6 | 5.0 | A | 6.0 | 5.9 | 0.9 | 19.9 | 15.4 | 55.2 | 8.7 | 0.1 | 0.7 | 7:3 |
| 7 | 6.0 | A | 6.0 | 5.5 | 0.2 | 27.2 | 5.3 | 58.0 | 8.7 | 0.3 | 0.5 | 6:4 |
| 8 | 6.0 | A | 6.0 | 5.9 | 0.2 | 19.9 | 15.4 | 55.2 | 8.7 | 0.1 | 0.7 | 7:3 |
| 9 | 6.9 | A | 6.0 | 5.5 | 0.2 | 27.2 | 5.3 | 58.0 | 8.7 | 0.2 | 0.6 | 6:4 |
| 10 | 6.9 | A | 6.0 | 5.9 | 0.2 | 19.9 | 15.4 | 55.2 | 8.7 | 0.1 | 0.7 | 7:3 |
| 11 | 5.5 | B | 6.5 | 5.5 | 0.2 | 27.2 | 5.3 | 58.0 | 8.7 | 0.2 | 0.6 | 6:4 |
| 12 | 5.5 | B | 6.5 | 5.9 | 0.2 | 19.9 | 15.4 | 55.2 | 8.7 | 0.1 | 0.7 | 7:3 |
| 13 | 5.5 | A | 6.0 | 5.0 | 0.1 | 22.8 | 8.8 | 52.1 | 15.0 | 1.0 | 0.3 | 7:3 |

| Experiment No. | Coefficient of thermal expansion of substrate | Resistor | Coefficient of thermal expansion of resistor | Coefficient of thermal expansion of overcoat | Rate of change of resistance (%) | Chemical composition of glass overcoat | | | | | | | other |
|---|---|---|---|---|---|---|---|---|---|---|---|---|---|
| | | | | | | $SiO_2$ | PbO | CaO | $Al_2O_3$ | ZnO | $B_2O_3$ | $K_2O$ | |
| 14 | 5.5 | B | 6.5 | 6.4 | 0.3 | 55.3 | 17.6 | 12.4 | 3.1 | | 5.2 | 3.6 | 2.8 |
| 15 | 5.5 | A | 6.0 | 6.4 | 2.5 | 55.3 | 17.6 | 12.4 | 3.1 | | 5.2 | 3.6 | 2.8 |
| 16 | 5.5 | A | 6.0 | 7.5 | 5.2 | 10.5 | 68.1 | | | 3.0 | 16.3 | | 2.1 |
| 17 | 5.5 | B | 6.5 | 7.5 | 4.7 | 10.5 | 68.1 | | | 3.0 | 16.3 | | 2.1 |

| Experiment No. | Coefficient of thermal expansion of substrate | Resistor | Coefficient of thermal expansion of resistor | Coefficient of thermal expansion of overcoat | Rate of change of resistance (%) | Chemical composition of glass overcoat | | | | | | glass:$Al_2O_3$ |
|---|---|---|---|---|---|---|---|---|---|---|---|---|
| | | | | | | CaO | $Al_2O_3$ | $SiO_2$ | $B_2O_3$ | $Cr_2O_3$ | other | |
| 18 | 5.5 | E | 5.5 | 5.3 | 0.2 | 24.3 | 5.2 | 52.3 | 16.4 | 1.5 | 0.3 | 6:4 |
| 19 | 5.5 | D | 5.7 | 5.5 | 0.2 | 24.3 | 5.2 | 52.3 | 16.4 | 1.5 | 0.3 | 7:3 |
| 20 | 5.5 | G | 5.7 | 5.5 | 0.2 | 24.3 | 5.2 | 52.3 | 16.4 | 1.5 | 0.3 | 7:3 |
| 21 | 5.5 | G | 5.7 | 5.3 | 0.1 | 24.3 | 5.2 | 52.3 | 16.4 | 1.5 | 0.3 | 6:4 |
| 22 | 5.5 | H | 5.7 | 5.5 | 0.2 | 24.3 | 5.2 | 52.3 | 16.4 | 1.5 | 0.3 | 7:3 |
| 23 | 5.5 | H | 5.7 | 5.3 | 0.1 | 24.3 | 5.2 | 52.3 | 16.4 | 1.5 | 0.3 | 6:4 |
| 24 | 5.5 | I | 5.7 | 5.5 | 0.1 | 24.3 | 5.2 | 52.3 | 16.4 | 1.5 | 0.3 | 7:3 |
| 25 | 5.5 | I | 5.7 | 5.3 | 0.1 | 24.3 | 5.2 | 52.3 | 16.4 | 1.5 | 0.3 | 6:4 |
| 26 | 5.5 | J | 5.7 | 5.5 | 0.2 | 24.3 | 5.2 | 52.3 | 16.4 | 1.5 | 0.3 | 7:3 |
| 27 | 5.5 | J | 5.7 | 5.3 | 0.1 | 24.3 | 5.2 | 52.3 | 16.4 | 1.5 | 0.3 | 6:4 |
| 28 | 5.5 | C | 5.8 | 5.5 | 0.2 | 24.3 | 5.2 | 52.3 | 16.4 | 1.5 | 0.3 | 7:3 |
| 29 | 5.5 | C | 5.8 | 5.7 | 0.5 | 24.3 | 5.2 | 52.3 | 16.4 | 1.5 | 0.3 | 8:2 |

TABLE 2-continued

| 30 | 5.5 | F | 5.9 | 5.5 | 0.1 | 24.3 | 5.2 | 52.3 | 16.4 | 1.5 | 0.3 | 7:3 |
| 31 | 5.5 | F | 5.9 | 5.7 | 0.2 | 24.3 | 5.2 | 52.3 | 16.4 | 1.5 | 0.3 | 8:2 |
| 32 | 5.5 | D | 5.7 | 5.7 | 1.1 | 24.3 | 5.2 | 52.3 | 16.4 | 1.5 | 0.3 | 8:2 |
| 33 | 5.5 | F | 5.9 | 5.9 | 1.2 | 24.3 | 5.2 | 52.3 | 16.4 | 1.5 | 0.3 | 9:1 |
| 34 | 5.5 | E | 5.5 | 5.9 | 1.5 | 24.3 | 5.2 | 52.3 | 16.4 | 1.5 | 0.3 | 9:1 |
| 35 | 5.5 | D | 5.7 | 5.9 | 1.7 | 24.3 | 5.2 | 52.3 | 16.4 | 1.5 | 0.3 | 9:1 |
| 36 | 5.5 | C | 5.8 | 5.9 | 1.9 | 24.3 | 5.2 | 52.3 | 16.4 | 1.5 | 0.3 | 9:1 |

Note: The unit of the coefficient to thermal expansion is $10^{-6}/°C$. and the chemical composition of each glass is expressed in wt. %.

It is apparent from Table 2 that, when the coefficient of thermal expansion of the resistor is higher than that of the glass overcoat as in Experiment Nos. 1 to 14 and 18–31, the rate of change of resistance is so small that cracking during laser trimming and thereafter is minimized. On the other hand, when the coefficient of thermal expansion of the resistor is equal to or lower than that of the glass overcoat as in Experiment Nos. 15 to 17 and 32 to 36, the rate of change of resistance becomes relatively large, so that the cracking during laser trimming and thereafter occurs frequently.

As apparent from the foregoing, the present invention provides a ceramic circuit substrate having on the surface thereof an external resistor comprising a resistor and an overcoat cofired therewith, prevents the cracking of the resistor at the time of trimming and thereafter, and realizes the exertion of resistance performance, thereby ensuring excellent weather resistance and stability.

What is claimed is:

1. A ceramic circuit substrate having a resistor deposited on a surface thereof, said ceramic substrate having a coefficient of thermal expansion ranging from $5.0×10^{-6}/°$ C. to $7.0×10^{-6}/°$ C., the resistor being coated with a glass overcoat and consisting essentially of 15 to 50% of $RuO_2$ and 85 to 50% of a $CaO—Al_2O_3—SiO_2—B_2O_3$ glass, the glass overcoat consisting essentially of 60 to 100% of a $CaO—Al_2O_3—SiO_2—B_2O_3$ glass and up to 40% of alumina, wherein the resistor has a coefficient of thermal expansion greater than that of the glass overcoat.

2. The ceramic circuit substrate of claim 1, wherein said ceramic substrate is prepared by firing a $CaO—SiO_2—Al_2O_3—B_2O_3$ glass or $MgO—SiO_2—Al_2O_3—B_2O_3$ glass.

3. The ceramic circuit substrate of claim 1, wherein said glass in the resistor consists essentially of 21.3 to 35.7% of CaO, 3.3 to 18.8% of $Al_2O_3$, 35.7 to 56.2% of $SiO_2$, and 7.1 to 33.3% of $B_2O_3$.

4. The ceramic circuit substrate of claim 1, wherein said glass overcoat consists essentially of 60 to 90% of the $CaO—Al_2O_3—SiO_2—B_2O_3$ glass and 10 to 40% of alumina.

5. The ceramic circuit substrate of claim 4, wherein said glass in the glass overcoat consists essentially of 19.9 to 27.2% of CaO, 5.2 to 15.4% of $Al_2O_3$, 52.1 to 58% of $SiO_2$, 8.7 to 16.4% of $B_2O_3$, and 0.1 to 1.5% of $Cr_2O_3$.

6. The ceramic circuit substrate of claim 1, wherein said ceramic substrate has a coefficient of thermal expansion of from $5.0×10^{-6}/°$ C. to $6.9×10^{-6}/°$ C., said resistor has a coefficient of thermal expansion of from $5.5×10^{-6}/°$ C. to $6.5×10^{-6}/°$ C. and said glass overcoat has a coefficient of thermal expansion of from $5.3×10^{-6}/°$ C. to $6.4×10^{-6}/°$ C.

* * * * *